US010219406B2

(12) United States Patent
Hu et al.

(10) Patent No.: US 10,219,406 B2
(45) Date of Patent: Feb. 26, 2019

(54) RADIO REMOTE UNIT AND COMMUNICATIONS DEVICE

(71) Applicant: Huawei Technologies Co., Ltd., Shenzhen (CN)

(72) Inventors: Weifeng Hu, Shanghai (CN); Vadim Tsoi, Kista (SE); Lei Li, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 707 days.

(21) Appl. No.: 14/843,007

(22) Filed: Sep. 2, 2015

(65) Prior Publication Data
US 2015/0382504 A1 Dec. 31, 2015

Related U.S. Application Data

(63) Continuation of application No. PCT/CN2013/085802, filed on Oct. 23, 2013.

(30) Foreign Application Priority Data

Mar. 6, 2013 (CN) .......................... 2013 1 0071869

(51) Int. Cl.
H05K 7/20 (2006.01)
H01L 23/367 (2006.01)
(Continued)

(52) U.S. Cl.
CPC ..... H05K 7/20209 (2013.01); H01L 23/3672 (2013.01); H01L 23/467 (2013.01);
(Continued)

(58) Field of Classification Search
CPC ........... H05K 7/20209; H05K 7/20154; H05K 7/20163; H05K 7/20563; H01L 23/3672;
(Continued)

(56) References Cited

U.S. PATENT DOCUMENTS 5,940,269 A  8/1999  Ko et al.
7,766,076 B2 8/2010  Khalili et al.
(Continued)

FOREIGN PATENT DOCUMENTS

CN 2519321 Y 10/2002
CN 2578977 Y 10/2003
(Continued)

OTHER PUBLICATIONS

Partial English Translation and Abstract of Chinese Patent Application No. CN101754644, Aug. 26, 2015, 4 pages.
(Continued)

Primary Examiner — Marc E Norman
(74) Attorney, Agent, or Firm — Conley Rose, P.C.

(57) ABSTRACT

A radio remote unit, including a unit body, and multiple heat dissipation fins that are disposed on a surface of the body, where an opening groove is disposed on the heat dissipation fin, and opening grooves on the multiple heat dissipation fins form a fan ventilation groove, where the fan ventilation groove is connected to ventilation channels between the heat dissipation fins, and a fan is disposed in a built-in manner in the fan ventilation groove. The fan ventilation groove formed by the opening grooves on the multiple heat dissipation fins is connected to the ventilation channels between the heat dissipation fins, and the fan is disposed, which implements that in a case in which a quantity of heat dissipation fins is unchanged, the fan performs air cooling on the radio remote unit, effectively improving a heat dissipation capability.

22 Claims, 3 Drawing Sheets

(51) Int. Cl.
*H01L 23/467* (2006.01)
*H04W 88/08* (2009.01)

(52) U.S. Cl.
CPC ..... *H05K 7/20154* (2013.01); *H05K 7/20163* (2013.01); *H05K 7/20563* (2013.01); *H01L 2924/0002* (2013.01); *H04W 88/08* (2013.01)

(58) Field of Classification Search
CPC ......... H01L 23/467; H01L 2924/0002; H04W 88/08
USPC ....................................................... 185/80.3
See application file for complete search history.

(56) References Cited

U.S. PATENT DOCUMENTS

| | | | |
|---|---|---|---|
| 2002/0098792 | A1 | 7/2002 | Hsiao |
| 2003/0079861 | A1 | 5/2003 | Lee |
| 2004/0264133 | A1 | 12/2004 | Fukuda et al. |
| 2006/0102324 | A1 | 5/2006 | Mok et al. |
| 2009/0168351 | A1 | 7/2009 | Chen et al. |
| 2010/0207705 | A1 | 8/2010 | Wang et al. |
| 2012/0222444 | A1 | 9/2012 | Li et al. |
| 2013/0070819 | A1* | 3/2013 | Zhao ............... H01Q 1/246 375/219 |

FOREIGN PATENT DOCUMENTS

| | | |
|---|---|---|
| CN | 101645714 A | 2/2010 |
| CN | 101662317 A | 3/2010 |
| CN | 201489433 U | 5/2010 |
| CN | 101754644 A | 6/2010 |
| CN | 101807930 A | 8/2010 |
| CN | 201547721 U | 8/2010 |
| CN | 201718149 U | 1/2011 |
| CN | 202282940 U | 6/2012 |
| CN | 102870511 A | 1/2013 |
| DE | 102009012504 A1 | 9/2010 |
| EP | 0614330 A1 | 8/1993 |
| WO | 2004105261 A1 | 12/2004 |
| WO | 2012021441 A1 | 2/2012 |

OTHER PUBLICATIONS

Partial English Translation and Abstract of Chinese Patent Application No. CN2519321, May 14, 2015, 9 pages.
Partial English Translation and Abstract of Chinese Patent Application No. CN2578977, May 14, 2015, 17 pages.
Partial English Translation and Abstract of Chinese Patent Application No. CN102870511, May 14, 2015, 22 pages.
Partial English Translation and Abstract of Chinese Patent Application No. CN202282940, May 14, 2015, 7 pages.
Foreign Communication From a Counterpart Application, Chinese Application No. 201310071869.0, Chinese Search Report dated Jul. 30, 2014, 8 pages.
Foreign Communication From a Counterpart Application, PCT Application No. PCT/CN2013/085802, English Translation of International Search Report dated Jan. 23, 2014, 2 pages.
Foreign Communication From a Counterpart Application, PCT Application No. PCT/CN2013/085802, English Translation of Written Opinion dated Jan. 23, 2014, 7 pages.
Machine Translation and Abstract of Chinese Publication No. CN201489433, May 26, 2010, 9 pages.
Machine Translation and Abstract of Chinese Publication No. CN201718149, Jan. 19, 2011, 5 pages.
Foreign Communication From a Counterpart Application, Chinese Application No. 201510190247.9, Chinese Office Action dated Nov. 15, 2016, 5 pages.
Foreign Communication From a Counterpart Application, Chinese Application No. 201510190247.9, Chinese Search Report dated Sep. 27, 2016, 2 pages.
Foreign Communication From a Counterpart Application, European Application No. 13877205.8, Extended European Search Report dated Jun. 1, 2016, 7 pages.

* cited by examiner

RADIO REMOTE UNIT AND COMMUNICATIONS DEVICE

CROSS-REFERENCE TO RELATED APPLICATIONS

This application is a continuation of International Application No. PCT/CN2013/085802, filed on Oct. 23, 2013, which claims priority to Chinese Patent Application No. 201310071869.0, filed on Mar. 6, 2013, both of which are hereby incorporated by reference in their entireties.

TECHNICAL FIELD

Embodiments of the present disclosure relate to heat dissipation technologies, and in particular, to a radio remote unit and a communications device.

BACKGROUND

With continuous development of communications technologies, to reduce construction costs of a base station system, operators are increasingly using a distributed base station, that is, a base station is divided into a building baseband unit (BBU) and a radio remote unit (RRU), where the RRU needs to be mounted near an antenna. Considering load bearing, wind resistance, and construction costs of an antenna pole, in this case, a volume and weight of the RRU should be minimized. In addition, as power of the RRU continuously increases, heat consumption of the RRU also increases.

In the, to ensure a heat dissipation capability of an RRU, an independent heat dissipation fan is generally added for the RRU. In this way, a volume and mass of the RRU cannot be effectively reduced, and when the heat dissipation fan becomes faulty, a heat dissipation fan assembly further affects air circulation around the RRU, thereby compromising a natural heat dissipation capability of the RRU.

SUMMARY

The present disclosure provides a radio remote unit and a communications device, which are configured to improve a heat dissipation capability on a premise of ensuring a natural heat dissipation function of the radio remote unit itself.

One aspect of the present disclosure provides a radio remote unit, including a unit body, and multiple heat dissipation fins that are disposed on a surface of the body, where an opening groove is disposed on the heat dissipation fin, and opening grooves on the multiple heat dissipation fins form a fan ventilation groove, where the fan ventilation groove is connected to ventilation channels between the heat dissipation fins, and a fan is disposed in a built-in manner in the fan ventilation groove.

In a first possible implementation manner of the one aspect of the present disclosure, a hollow fan ventilation duct is disposed at the fan ventilation groove, a height of the fan ventilation duct is less than a height of the heat dissipation fins, and air outlets are disposed on an exterior wall that is along a height direction of the fan ventilation duct, and are connected to the ventilation channels between the heat dissipation fins.

With reference to the one aspect of the present disclosure or the first possible implementation manner of the one aspect, in a second possible implementation manner, the fan is disposed at an end of the fan ventilation groove.

With reference to the first possible implementation manner of the one aspect of the present disclosure, in a third possible implementation manner, the fan uses a blowing mode.

In a fourth possible implementation manner of the one aspect of the present disclosure, a shape of the fan ventilation groove is that cross-sectional areas of N opening grooves of the fan ventilation groove gradually increase or stepwise increase along a direction that is toward the fan, so that the fan ventilation groove evenly allocates heat dissipation airflow, where N is a quantity of the heat dissipation fins.

In a fifth possible implementation manner of the one aspect of the present disclosure, a flow direction of the fan is perpendicular to or parallel with the surface of the body.

With reference to the fifth possible implementation manner of the one aspect of the present disclosure, in a sixth possible implementation manner of the one aspect of the present disclosure, in a state in which the flow direction of the fan is parallel with the surface of the body, the fan is disposed in the fan ventilation groove and away from the surface of the body.

In a seventh possible implementation manner of the one aspect of the present disclosure, the multiple heat dissipation fins are straight line segments parallel with each other or are of a curvilinear shape.

With reference to the foregoing possible implementation manners of the one aspect of the present disclosure, in an eighth possible implementation manner of the one aspect, the fan is a blade-rotating fan, or an air velocity generation apparatus that is configured to generate heat dissipation airflow.

Another aspect of the present disclosure provides a communications device, including the radio remote unit in the foregoing possible implementation manners, and further including a building baseband unit and an antenna, where the building baseband unit is connected to the radio remote unit, and the radio remote unit is connected to the antenna.

According to the radio remote unit provided in the embodiments, an opening groove is disposed on a heat dissipation fin, and opening grooves on multiple heat dissipation fins form a fan ventilation groove, where the fan ventilation groove is connected to ventilation channels between the heat dissipation fins; and a fan is disposed in a built-in manner in the fan ventilation groove, which implements that in a case in which a quantity of heat dissipation fins is unchanged, the fan performs air cooling on the radio remote unit, effectively improving a heat dissipation capability. Meanwhile, a consideration is given to a natural heat dissipation capability of the radio remote unit itself, so that when the fan becomes faulty, natural airflow may still pass through the ventilation channels between the heat dissipation fins, and the natural heat dissipation capability of the radio remote unit is ensured. In addition, it is not required to increase a surface area of the radio remote unit, thereby reducing manufacturing costs of the radio remote unit and a requirement on load bearing, wind resistance and other factors of an antenna pole for bearing the radio remote unit.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

Figure 1:
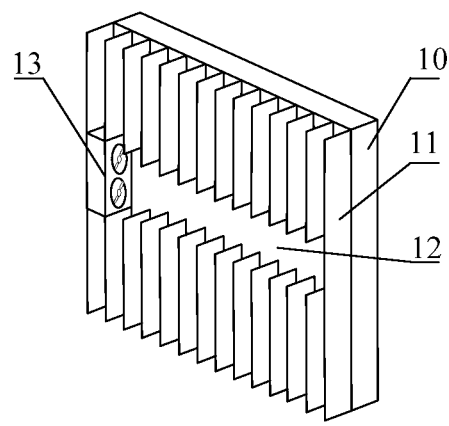
FIG. 1 is a schematic diagram of a stereoscopic structure of a first radio remote unit according to an embodiment of the present disclosure.

FIG. 1 is a schematic diagram of a stereoscopic structure of a first radio remote unit according to an embodiment of the present disclosure. As shown in FIG. 1, the RRU includes a unit body 10, and multiple heat dissipation fins 11 that are disposed on a surface of the body, where an opening groove is disposed on the heat dissipation fin 11, and opening grooves on the multiple heat dissipation fins 11 form a fan ventilation groove 12, where the fan ventilation groove 12 is connected to ventilation channels between the heat dissipation fins 11; and a fan 13 is disposed in a built-in manner in the fan ventilation groove 12.

As shown in FIG. 1, a flow direction of the fan 13 is perpendicular to the surface of the body on which the heat dissipation fins are disposed. The fan 13 may be in a suction mode, or may be in a blowing mode. In FIG. 1, the multiple heat dissipation fins 11 and the fan 13 are disposed on only one side of the RRU. The foregoing structure may be disposed on multiple surfaces of the RRU.

After the fan 13 generates heat dissipation airflow, the heat dissipation airflow separately enters the ventilation channels between the heat dissipation fins 11 by using the fan ventilation groove 12. In addition, because of a buoyant force of hot air itself, natural airflow also passes upward, in a height direction, through the ventilation channels between the heat dissipation fins 11.

According to the RRU provided in this embodiment, an opening groove is disposed on a heat dissipation fin, and opening grooves on multiple heat dissipation fins form a fan ventilation groove, where the fan ventilation groove is connected to ventilation channels between the heat dissipation fins; and a fan is disposed in a built-in manner in the fan ventilation groove, which implements that in a case in which a quantity of heat dissipation fins is unchanged, the fan performs air cooling on the RRU, effectively improving a heat dissipation capability. Meanwhile, a consideration is given to a natural heat dissipation capability of the RRU itself, so that when the fan becomes faulty, natural airflow may still pass through the ventilation channels between the heat dissipation fins, and the natural heat dissipation capability of the RRU is ensured. In addition, it is not required to increase a surface area of the RRU, thereby reducing manufacturing costs of the RRU and a requirement on load bearing, wind resistance and other factors of an antenna pole for bearing the RRU.

Figure 2:
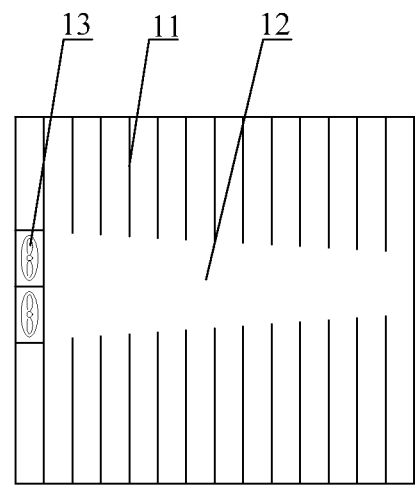
FIG. 2 is a front view of a structure of a second radio remote unit according to an embodiment of the present disclosure.

Further, a shape of the fan ventilation groove 12 is preferably that cross-sectional areas of N opening grooves of the fan ventilation groove 12 gradually increase or stepwise increase along a direction that is toward the fan 13, so that the fan ventilation groove evenly allocates heat dissipation airflow, that is, air volumes that pass through air outlets 141 (see FIG. 3) are even. In addition, N is a quantity of heat dissipation fins. FIG. 2 is a front view of a structure of a second radio remote unit according to an embodiment of the present disclosure. Referring to FIG. 2, the shape of the fan ventilation groove 12 is that the cross-sectional areas of the N opening grooves of the fan ventilation groove 12 gradually increase or stepwise increase along a direction that is toward the fan 13. For the fan 13 in FIG. 1 and FIG. 2, the suction mode or the blowing mode may be used, and the multiple heat dissipation fins 11 are straight line segments parallel with each other.

Figure 3:
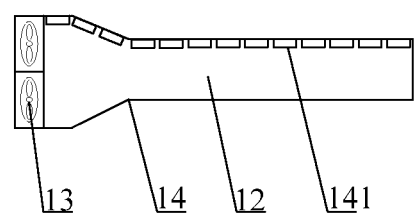
FIG. 3 is a schematic structural diagram of a fan ventilation duct in a radio remote unit according to an embodiment of the present disclosure.

Further, a hollow fan ventilation duct may be disposed at the fan ventilation groove 12 in FIG. 2, where a height of the fan ventilation duct 12 is less than a height of the heat dissipation fins 11, so that natural heat dissipation airflow passes through a gap formed by a height difference between the fan ventilation duct 12 and the heat dissipation fin 11, so as to improve a heat dissipation capability. FIG. 3 is a schematic structural diagram of a fan ventilation duct in a radio remote unit according to an embodiment of the present disclosure. As shown in FIG. 3, air outlets 141 are disposed on an exterior wall that is along a height direction of the fan ventilation duct 14, that is, multiple air outlets 141 are disposed on an upper side in the height direction of the fan ventilation duct 14, and the air outlets 141 of the fan ventilation duct 14 are connected to the ventilation channels between the heat dissipation fins. An end of the fan ventilation duct 14 is connected to the fan 13. The fan ventilation duct 14 and the fan 13 may be fastened together, or may be separately fastened on the surface of the unit body. A shape of the fan ventilation duct 14 in FIG. 3 is that the cross-sectional areas toward the fan 13 stepwise increase. and alternatively, the shape of the fan ventilation duct 14 may be that cross-sectional areas toward the fan 13 gradually increase. That the cross-sectional areas toward the fan 13 stepwise increase or gradually increase may ensure that air volumes that pass through the air outlets 141 are even.

Figure 4:
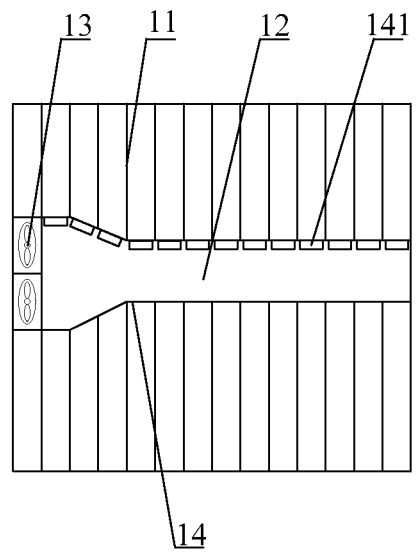
FIG. 4 is a front view of a structure of a third radio remote unit according to an embodiment of the present disclosure.

FIG. 4 is a front view of a structure of a third radio remote unit according to an embodiment of the present disclosure. Referring to FIG. 4, a hollow fan ventilation duct 14 is disposed at the fan ventilation groove 12 in FIG. 1, so that heat dissipation airflow generated by the fan 13 passes through the hollow fan ventilation duct 14. A height of the fan ventilation duct 14 is less than a height of the heat dissipation fins 11, so as to form a gap. In this way, heat dissipation airflow in ventilation channels between lower-side heat dissipation fins 11 of the fan ventilation duct 14 may pass through the gap and flow to ventilation channels between upper-side heat dissipation fins 11, which ensures a natural heat dissipation function. In addition, air outlets 141 are disposed on an exterior wall that is along a height direction of the fan ventilation duct 14, and are connected to the ventilation channels between the heat dissipation fins 11. It should be noted that, resistance matching is performed by adjusting shapes, sizes, and positions of the air outlets 141, so as to ensure that air volumes of the ventilation channels from left to right that are between the heat dissipation fins 11 and connected to the air outlets 141 are even. Compared with that air outlets are disposed on both sides, power consumption of the fan 13 is lower in the case that the air outlets 141 are disposed only on the exterior wall that is along the height direction. Heat dissipation airflow generated by the fan 13 in the blowing mode passes through the air outlets 141 by using the fan ventilation duct 14 and finally passes through the ventilation channels between the heat dissipation fins 11, so as to perform heat dissipation, by means of air cooling, on the unit body. In addition, the fan 13 is disposed at an end of the fan ventilation groove 12.

Figure 5:
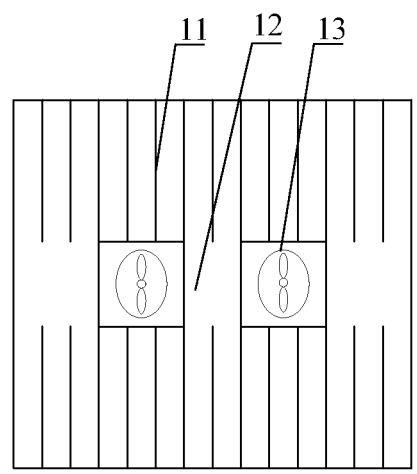
FIG. 5 is a front view of a structure of a fourth radio remote unit according to an embodiment of the present disclosure.
Figure 6:
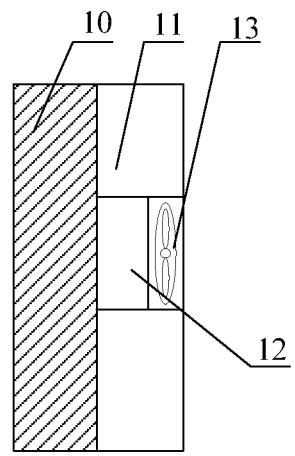
FIG. 6 is a side view of a structure of a fourth radio remote unit according to an embodiment of the present disclosure.

FIG. 5 is a front view of a structure of a fourth radio remote unit according to an embodiment of the present disclosure. FIG. 6 is a side view of a structure of a fourth radio remote unit according to an embodiment of the present disclosure. Referring to FIG. 5 and FIG. 6, in a state in which the flow direction of the fan 13 is parallel with the surface of the body, the fan 13 is disposed in the fan ventilation groove 12 and away from the surface of the body. In addition, the fan 13 uses the blowing mode.

Referring to FIG. 6, a gap exists between the fan 13 and the unit body 10, and natural airflow between the heat dissipation fins 11 may flow by using the gap to ensure a natural heat dissipation function.

Figure 7:
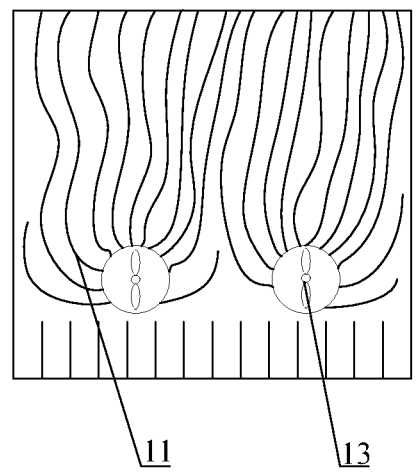
FIG. 7 is a front view of a structure of a fifth radio remote unit according to an embodiment of the present disclosure.

Further, in a state in which the flow direction of the fan is parallel with the surface of the body, FIG. 7 is a front view of a structure of a fifth radio remote unit according to an embodiment of the present disclosure. Similar to the fan 13 in FIG. 6, referring to FIG. 7, the fan 13 is disposed in the fan ventilation groove 12 and away from the surface of the body. The multiple heat dissipation fins 11 are of a curvilinear shape.

In a case in which heat dissipation is performed completely by means of forced air cooling, as shown in FIG. 7, the heat dissipation fins 11 may use a curved surface, where the curved surface of the heat dissipation 11 is streamline and meets a requirement of aerodynamics, so that in a forced air cooling state, the heat dissipation airflow generated by the fan 13 in the blowing mode flows more smoothly, and a heat dissipation effect is improved. Alternatively, parallel linear heat dissipation fins 11 are disposed more densely, a heat dissipation area is increased by disposing dense heat dissipation fins 11, and meanwhile, the fan 13 uses the blowing mode.

In addition, in the foregoing embodiments, the fan may be a blade-rotating fan, or an air velocity generation apparatus that is configured to generate heat dissipation airflow. The air velocity generation apparatus may be a piezoelectric fan, a vibration fan, or the like. It should be noted that a quantity of fans is not limited in the foregoing embodiments.

Figure 8:
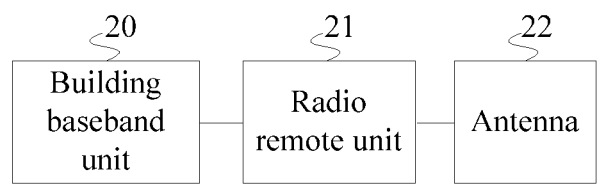
FIG. 8 is a schematic structural diagram of a communications device according to an embodiment of the present disclosure.

FIG. 8 is a schematic structural diagram of a communications device according to an embodiment of the present disclosure. Referring to FIG. 8, the communications device includes a radio remote unit 21, and further includes a building baseband unit 20 and an antenna 22.

The radio remote unit 21 may use the structures shown in FIG. 1 to FIG. 7, and correspondingly, may execute the technical solutions in the foregoing embodiments of the present disclosure.

As shown in FIG. 8, the building baseband unit 20 is connected to the radio remote unit 21, and the radio remote unit 21 is connected to the antenna 22.

The building baseband unit (BBU) 20 may be connected to the radio remote unit 21 by using an optical fiber. The building baseband unit 20 is configured to perform baseband processing on a signal to be sent by the communications device, and then the radio remote unit 21 performs radio-frequency signal processing on a signal on which baseband processing has been performed, and the signal is sent by using the antenna 22. Alternatively, the radio remote unit 21 performs radio-frequency signal processing on a signal received by the antenna 22, and after the building baseband unit 20 performs baseband processing on the signal on which radio-frequency signal processing has been performed, the signal is subsequently transmitted. Generally, the building baseband unit 20 may be connected to multiple radio remote units 21. Correspondingly, a quantity of antennas 22 is corresponding to the radio remote unit 21.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A radio remote unit, comprising:
   a unit body; and
   multiple heat dissipation fins disposed on a surface of the body, an opening groove being disposed on the multiple heat dissipation fins, the opening grooves on the multiple heat dissipation fins forming a fan ventilation groove, the fan ventilation groove being coupled to ventilation channels between the multiple heat dissipation fins, and a fan being disposed in a built-in manner in the fan ventilation groove.

2. The radio remote unit of claim 1, wherein a hollow fan ventilation duct is disposed at the fan ventilation groove, a height of the fan ventilation duct being less than a height of the multiple heat dissipation fins, air outlets being disposed on an exterior wall along a height direction of the fan ventilation duct, and the air outlets being coupled to the ventilation channels between the multiple heat dissipation fins.

3. The radio remote unit of claim 1, wherein the fan is disposed at an end of the fan ventilation groove.

4. The radio remote unit of claim 3, wherein the fan is capable of operating in a blowing mode.

5. The radio remote unit of claim 1, wherein cross-sectional areas of N opening grooves of the fan ventilation groove gradually increase along a direction that is toward the fan such that the fan ventilation groove evenly allocates heat dissipation airflow, and N being a quantity of the multiple heat dissipation fins.

6. The radio remote unit of claim 1, wherein cross-sectional areas of N opening grooves of the fan ventilation groove stepwise increase along a direction that is toward the fan such that the fan ventilation groove evenly allocates heat dissipation airflow, and N being a quantity of the multiple heat dissipation fins.

7. The radio remote unit of claim 1, wherein a flow direction of the fan is perpendicular to the surface of the body.

8. The radio remote unit of claim 1, wherein a flow direction of the fan is parallel with the surface of the body.

9. The radio remote unit of claim 8, wherein the fan is disposed in the fan ventilation groove and away from the surface of the body.

10. The radio remote unit of claim 1, wherein the multiple heat dissipation fins are straight line segments parallel with each other or are of a curvilinear shape.

11. The radio remote unit of claim 1, wherein the fan is a blade-rotating fan or an air velocity generation fan configured to generate heat dissipation airflow.

12. The radio remote unit according to claim 1, wherein the fan is disposed on the surface of the unit body.

13. A communications device, comprising:
a radio remote unit comprising:
a unit body; and
multiple heat dissipation fins that are disposed on a surface of the body, an opening groove being disposed on the multiple heat dissipation fins, opening grooves on the multiple heat dissipation fins forming a fan ventilation groove, the fan ventilation groove being coupled to ventilation channels between the multiple heat dissipation fins, and a fan being disposed in a built-in manner in the fan ventilation groove;
a building baseband unit that is coupled to the radio remote unit; and
an antenna that is coupled to the radio remote unit.

14. The communications device of claim 13, wherein a hollow fan ventilation duct is disposed at the fan ventilation groove, a height of the fan ventilation duct being less than a height of the multiple heat dissipation fins, air outlets being disposed on an exterior wall along a height direction of the fan ventilation duct, and the air outlets being coupled to the ventilation channels between the multiple heat dissipation fins.

15. The communications device of claim 13, wherein the fan is disposed at an end of the fan ventilation groove.

16. The communications device of claim 15, wherein the fan is capable of operating in a blowing mode.

17. The communications device of claim 13, wherein cross-sectional areas of N opening grooves of the fan ventilation groove gradually increase or stepwise increase along a direction that is toward the fan such that the fan ventilation groove evenly allocates heat dissipation airflow, and N being a quantity of the multiple heat dissipation fins.

18. The communications device of claim 13, wherein a flow direction of the fan is perpendicular to or parallel with the surface of the body.

19. The communications device of claim 18, wherein when the flow direction of the fan is parallel with the surface of the body, the fan is disposed in the fan ventilation groove and away from the surface of the body.

20. The communications device of claim 13, wherein the multiple heat dissipation fins are straight line segments parallel with each other or are of a curvilinear shape.

21. The communications device of claim 13, wherein the fan is a blade-rotating fan or an air velocity generation fan configured to generate heat dissipation airflow.

22. The communications device according to claim 13, wherein the fan is disposed on the surface of the unit body.

* * * * *

UNITED STATES PATENT AND TRADEMARK OFFICE
CERTIFICATE OF CORRECTION

| | |
|---|---|
| PATENT NO. | : 10,219,406 B2 |
| APPLICATION NO. | : 14/843007 |
| DATED | : February 26, 2019 |
| INVENTOR(S) | : Weifeng Hu, Vadim Tsoi and Lei Li |

It is certified that error appears in the above-identified patent and that said Letters Patent is hereby corrected as shown below:

On the Title Page

Item (30): "201310071869" should read "201310071869.0"

In the Specification

Column 6, Line 49: "duet" should read "duct"

Signed and Sealed this
Second Day of April, 2019

Andrei Iancu
*Director of the United States Patent and Trademark Office*